INVENTORS
DONALD P. FAULK
WILLIAM J. GERBER
BY
[signature]
ATTORNEY

INVENTORS
DONALD P. FAULK
WILLIAM J. GERBER
BY
[signature]
ATTORNEY

*INVENTORS*
DONALD P. FAULK
WILLIAM J. GERBER

*BY* Francis [signature]
ATTORNEY

United States Patent Office 3,051,919
Patented Aug. 28, 1962

3,051,919
FILTER-TRANSFORMERS
Donald P. Faulk, Shaker Heights, and William J. Gerber, Willoughby, Ohio, assignors to Clevite Corporation, Cleveland, Ohio, a corporation of Ohio
Filed Sept. 17, 1958, Ser. No. 761,522
8 Claims. (Cl. 333—72)

This invention relates to frequency selective impedance transformation devices.

The importance of matching impedances to obtain optimum power transfer in electrical and electronic circuits has long been recognized. Impedance matching is particularly critical in the coupling of successive stages in communications circuitry wherein electromagnetic inter-stage coupling transformers are employed almost universally, at least in the I.F. stages. Such transformers commonly have one or both coils "tuned" to provide filtering as well as transformation.

With the advent and growing popularity of transistorized circuits, the matter of impedance matching has taken on new importance. High gain transistor stages characteristically have a rather wide disparity between input and output impedance with the result that the difficulty in matching impedances has increased. In addition, the transistor has given impetus to the trend toward miniaturization so that miniaturization of transformation devices has become highly desirable.

It is the general object of the present invention to provide novel frequency selective impedance transformers which are extremely compact and more efficient than conventional electromagnetic transformation devices.

Another important object is the provision of a combined wave filter and impedance transformer which has response characteristics superior to conventional single-tuned electromagnetic transformers.

Still another object is the provision of a combined wave filter and impedance transformer which has a response characteristic at least equivalent to that of conventional doubled-tuned electromagnetic transformers but smaller in size, lower in cost and simpler in construction.

These and further objects, the several advantages of the invention and the manner in which these objects and advantages are attained will be apparent to those conversant with the art from the following description and subjoined claims taken in conjunction with the annexed drawings in which:

Figure 7:
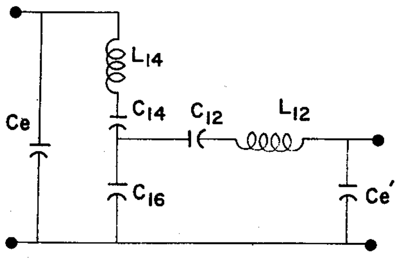
Figure 8:
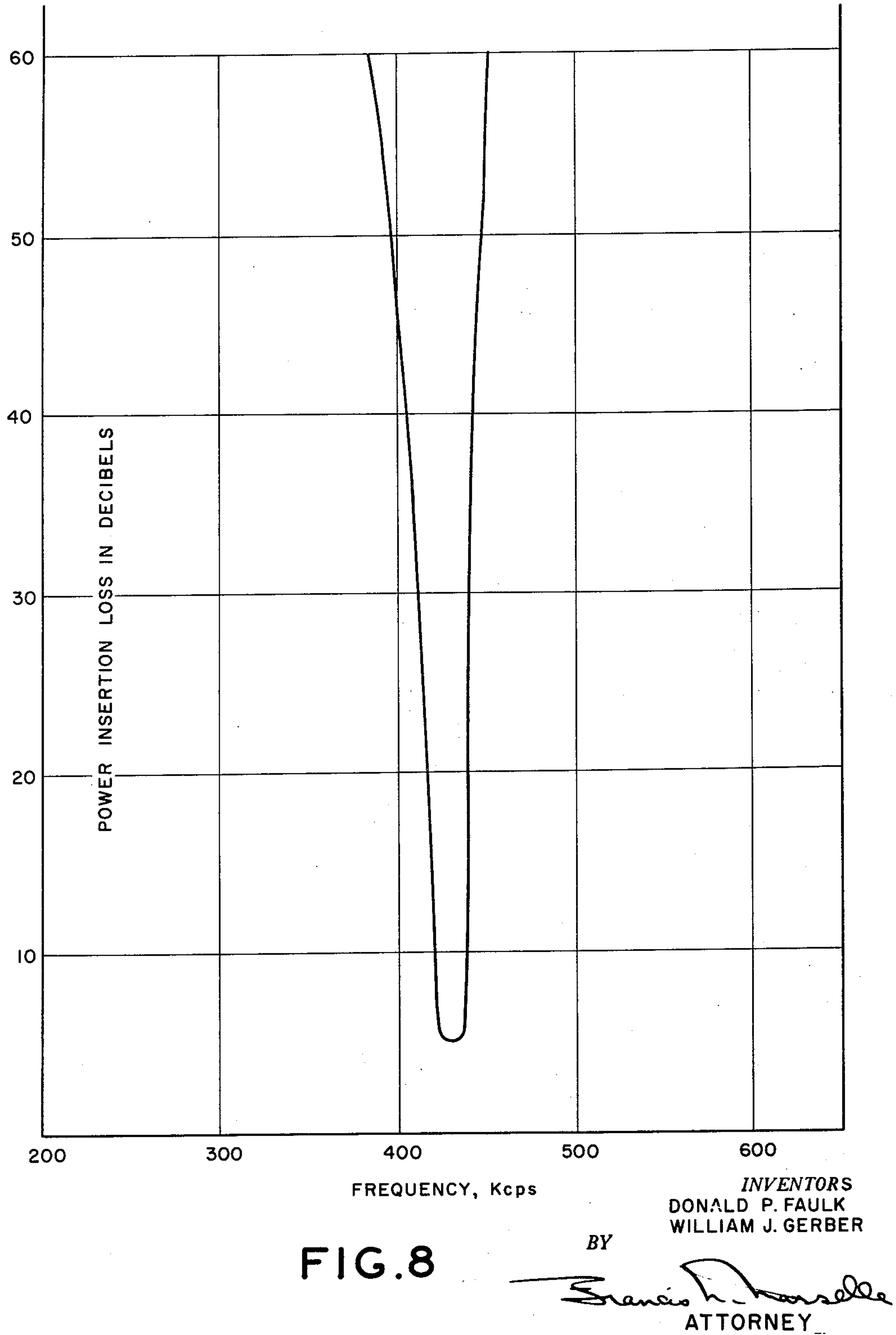

FIGURES 6*a*, 6*b*, 6*c* and 6*d* are equivalent circuit diagrams for a filter-transformer element according to the invention showing the conversion from a ladder to a lattice-type network;

FIGURE 7 is an additional equivalent circuit diagram for filter-transformer elements in accordance with the invention; and FIGURE 8 is a curve of measured insertion loss plotted against frequency, typical of the performance of the filter-transformer elements of the invention.

In accordance with the present invention, frequency selective impedance transformers comprise a pair of piezoelectric resonators, one resonant at a preselected frequency and the other anti-resonant at the same frequency, and means mechanically coupling the resonators and adapted to transmit vibrations from one to the other. The resonators are discoid bodies juxtaposed in parallel coaxial relation and having central portions mechanically coupled. The discoid bodies are composed of a ferroelectric ceramic material which is capable of accepting and retaining a permanent remanent electrostatic polarization which imparts piezoelectric properties to it. The ceramic bodies are poled in an axial direction. Electrode means are applied to opposed surfaces of each of the ceramic bodies.

Before describing in detail the physical aspects of devices according to the invention, the nature, properties and examples of the specific electromechanically responsive ceramic materials utilized therein will be disclosed. These materials, hereinafter referred to as polarizable ferroelectric ceramics, are generally well known in the art. They consist of polycrystalline aggregates of certain ceramic raw materials, formulated and fired to ceramic maturity in accordance with generally conventional ceramic techniques. For the most part these ceramics are characterized by a perovskite type crystal structure although this is not necessarily the case.

Well known examples of suitable materials are barium titanate and solid solutions of lead zirconate and lead titanate. These ceramics are ferroelectric and when conditions, i.e., "poled" of "polarized" by the application of a strong electrostatic field, develop properties similar to the piezoelectric effect which is a natural characteristic of many crystalline materials, such as quartz and Rochelle salt. The manner of fabricating and polarizing barium titanate ceramic is disclosed in detail in U.S. Patent No. 2,486,560 to Gray. A similar disclosure with respect to lead zirconate titanate ceramic is made in U.S. Patent No. 2,708,244 to Bernard Jaffe.

It is important to note that ferroelectric ceramic bodies, when polarized, have certain properties which distinguish them from naturally piezoelectric materials such as quartz and Rochelle salt. First of all, the ceramics are characterized by a significantly higher piezoelectric response having planar coupling coefficients in the order of 50%. In addition, because of their ceramic nature, they are capable of being formed into desired shapes by simple fabricating procedures well known in the ceramic arts. One of the most important features of ferroelectric ceramic materials is the fact that they are isotropic in a plane perpendicular to the axis or direction of polarization. Disks of such ceramics, therefore, have both an axial (or thickness) and a true radial (or circumferential expansional) mode of vibration. The radial mode, which is essential to resonator elements according to the invention, does not exist as an isolated mode in quartz or even in single crystals of ferroelectric materials.

The particular ferroelectric ceramic employed will depend on design requirements for and operating conditions of the filter.

Substantially pure barium titanate and lead zirconate titanate ceramics are usable materials for the purposes of the invention. However, it is characteristic of many ferroelectric ceramics that the frequency constants, coupling coefficients and dielectric constants "age," i.e., increase or decrease with the passage of time and, further, are subject to variation in accordance with ambient temperature changes. Thus, for example, with the passage of time the frequency constant increases, the coupling coefficient decreases and the dielectric constant increases.

Ferroelectric ceramics in which aging and/or temperature dependence are minimized are available in the form of certain chemical modifications of lead zirconate titanate which are disclosed and claimed in U.S. Letters Patent No. 2,906,710, issued to Kulcsar et al. on a copending application filed August 11, 1955; U.S. Letters Patent No. 2,911,370 issued to F. Kulcsar on a copending application Serial No. 756,838, filed August 25, 1958 as a continuation-in-part of applications Serial Nos. 550,868 and 550,869, now abandoned; and copending application Serial No. 805,985, filed April 13, 1959 as a continuation-in-part of application Serial No. 686,937, now abandoned, all of which are assigned to the same assignee as the present invention. Inasmuch as the physical and electrical properties rather than the chemical composition of the ceramic compositions is the important consideration and because further improvements in the materials undoubtedly will be made from time to time, the optimum properties to be used as criteria in the selection of ceramic materials will be listed in the order of their importance:

(1) Time and temperature stability of resonant frequency.

(2) High mechanical Q.

(3) Time and temperature stability of other properties, e.g., dielectric constant, mechanical Q.

(4) Relatively low dissipation.

(5) Substantial electromechanical coupling.

For the purposes of example and this disclosure, data given herein are based on the use of a preferred material, viz., a modified lead zirconate titanate having the composition expressed by the formula:

$$Pb_{0.95}Sr_{0.05}(Zr_{0.53}Ti_{0.47})O_3+0.7$$

weight percent $Cr_2O_3$.

This material is hereinafter referred to as the "preferred" composition, ceramic or material.

From the foregoing it will be appreciated that the present invention contemplates the use, not only of the materials specifically disclosed, directly or by reference, but also any other ferroelectric ceramic materials now known or hereinafter discovered which possess the requisite properties.

Figure 1:
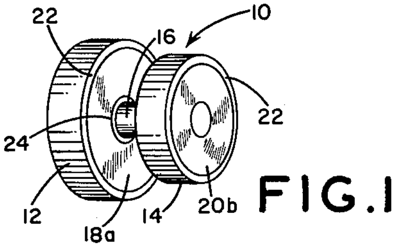
FIGURE 1 is a perspective elevational view of one form of filter-transformer element according to the invention.

Referring now to the drawings and first, particularly, to FIGURE 1, numeral 10 designates in its entirety one form of filter-transformer element in accordance with the present invention. In the illustrated embodiment, element 10 comprises a pair of discoid bodies 12 and 14 mounted coaxially on a cylindrical coupling rod or axle 16. For ease of reference, the discoid bodies will be referred to simply as "disks" even though these bodies may not be disks in the precise geometric sense of the term. Disks 12 and 14 are formed of a ferroelectric ceramic material such as hereinbefore described. The opposite major faces of disks 12 and 14 are electroded in accordance with known techniques to provide on each disk an electrode pair consisting of an annular inner electrode **18*a*, 18*b* and an outer electrode 20*a*, 20*b* which may be annular or circular. A small unelectroded margin 22 is provided between the electrodes and the circumferential edges of the respective disks. A similar margin 24 isolates the electrodes from rod 16** under certain circumstances where the rod or its surface is electrically conductive.

Disks 12 and 14 are polarized in the thickness direction as hereinbefore explained. For this purpose the operating electrode pairs **18*a*, 20*a* and 18*b*, 20*b* may be utilized and poling performed after the assembly 10** is complete or special poling electrodes (not shown) may be applied for use in poling and thereafter removed and replaced with operating electrodes.

Figure 2:
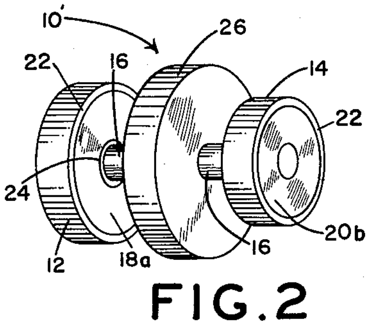
FIGURE 2 is a perspective elevational view similar to FIGURE 1 showing a modified form of filter-transformer element.

If desired one or more intermediate disks may be provided on rod 16 between disks 12 and 14 as described and claimed in copending application for U.S. Letters Patent No. 2,877,432 issued to O. Mattiat on a copending application Serial No. 633,052, filed January 8, 1957 and assigned to the same assignee as the present invention. A filter-transformer element 10' of this type, having a single intermediate disk 26 is illustrated in FIGURE 2. All other parts of this element are the same as their correspondingly numbered counterparts in FIGURE 1. The intermediate disk or disks may be of the same ceramic material as disks 12 and 14 but need not be polarized; alternatively, they may be of a different ceramic material which, because no poling is necessary, need not be ferroelectric, or they may be of a suitable metal. One metal suitable for the intermediate disks is a nickel alloy commercially available under the trade name Ni-Span-C. It has a high mechanical Q and low temperature dependence of frequency. For further information regarding the filter aspects of the elements 10 and 10' and the use of intermediate disks, reference may be had to the aforementioned U.S. Patent No. 2,877,432.

The diameter of coupling rod 16 is small in comparison to the diameter of the disks but large enough to give the desired degree of mechanical coupling. The spacing between disks and the diameter of the coupling rod are important parameters; the precise relation of these dimensions and their effect will be explained as this description proceeds.

In accordance with the present invention, one of the end disks 12 or 14 is proportioned to exhibit a resonance of mechanical vibration in the radial mode at a predetermined frequency which substantially coincides with the center frequency of the desired pass band. The other is proportioned to have its anti-resonant condition at substantially the same frequency. For any given material the resonant frequency of a thin disk would be a function primarily of its diameter; the larger the diameter the lower the resonant and anti-resonant frequencies, the latter, of course, being the higher of the two.

In the drawing, disk 14 is assumed to be the resonant disk, having its fundamental radial mode resonance at a predetermined frequency, say 455 kc. which may be considered the center frequency of an I.F. band pass filter. In order that disk 12 be anti-resonant at the same frequency it would have a slightly larger diameter than disk 14. In the interest of clarity, the difference in diameter, as well as all other dimensions, is greatly exaggerated in the drawings.

One specific example of a satisfactory filter element of the preferred material embodied the following approximate dimensions:

| | Mm. |
|---|---|
| Diameter of disk **12** | 5 |
| Diameter of disk **14** | 5 |
| Diameter of rod **16** | 1 |
| Length of rod **16** | 1 |
| Thickness of disks **12, 14** | 1 |

The preferred ceramic material was employed and had the following characteristic properties:

Electromechanical coupling, coefficient $kp$ (max): 0.39
Mechanical quality factor, $Qm$: 400
Relative dielectric constant, K: 1000
Young's modulus: $8.7\times10^{10}$ newtons/m.$^2$ Having been proportioned to have at least approximately the desired resonant frequency, the disks can then be "tuned" more precisely by mass loading as, for example, by silver plating the circumferential edges of the disks and applying a thin layer of solder thereto. The unelectroded margins 22 function to electrically isolate the electrode pairs **18*a*, 20*a* and 18*b*, 20*b*** from, and prevent short circuiting by, the silver plating and solder on the circumferential edges of the disks.

In the interest of obtaining maximum efficiency in operation, the acoustic impedance of the material of rod 16 should match that of the disks as closely as feasible and compatible with other considerations.

This matching is, of course, ideal where disks 12, 14 and rod 16 are of the same material. To this end, element 10 preferably is formed in two monolithic parts—

Figure 3:
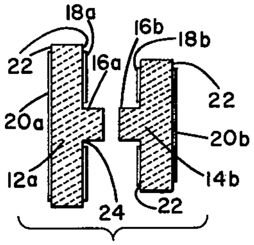
FIGURE 3 is an exploded longitudinal sectional view showing a detail of construction of a filter-transformer element such as that shown in FIGURE 1.

12*a*, 14*b* as shown in FIGURE 3. Each part consists of a disk, 12 or 14, and a respective integral stub shaft 16*a* or 16*b*. Joined in coaxial abutting relation, stubs 16*a* and 16*b* jointly comprise the coupling rod or axle 16. Joinder of the stubs can best be accomplished by use of commercially available electrically conductive epoxy resins. While it is preferred that each part, 12*a* and 14*b*, carry half of rod 16, it will be appreciated that the entire rod can be formed integral with one disk.

As will be more fully explained in describing the operation of filter-transformer element 10, an A.-C. signal is applied to the electrodes of one end disk, e.g., 12 and the filtered signal is derived from the electrodes of the other end disk, i.e., 14. The electrical connections to filter-transformer element 10 for supplying and deriving, respectively, an input and output signal are, in themselves, conventional and optional. A test circuit for accomplishing this is shown schematically in FIGURE 4 and will be described as this description proceeds. Conveniently, one electrode of each pair can be connected to a common or ground potential. Thus, for example, inner electrodes 18*a* and 18*b* can be grounded and the input signal applied between electrode 20*a* of disk 12 and ground while the output is derived between electrode 20*b* of disk 14 and ground. Where rod 16 or at least its surface is conductive, grounding can be accomplished conveniently by extending the respective inner electrodes 18*a* and 18*b* into contact with the surface of the rod, i.e., by eliminating margins 24. If desired, additional impedance transformation can be achieved by varying the ratio of the area of the input disk electrodes to that of the output disk electrodes.

The filter-transformer elements 10 and 10′ are mounted in any suitable manner; preferably they are disposed between resilient spring members (not shown) contacting the centers of the outside faces of disks 12 and 14.

Preparatory to describing the operation of filter-transformer element 10, the impedance characteristics of the disks 12 and 14 will be explained with reference to FIGURE 5. The curves are generalized rather than actual and indicate the frequency variation of electrical impedance of the respective disks 12 and 14. The shape of the curves is typical of piezo-electric resonators being characterized by a relatively sharp dip to a minimum impedance point at the resonant frequency followed closely by an equally sharp peaking of impedance at the anti-resonant frequency. As shown by the curves the resonant disk 14 has its minimum impedance at a preternimed frequency, say 455 kc. for the center frequency of an I.F. filter-transformer. Vibrating at this same frequency, anti-resonant disk 12 exhibits a maximum impedance.

With these impedance characteristics in mind, the operation of element 10 as an I.F. (e.g., 455 kc.) band-pass filter-transformer is as follows: the input signal is applied, through suitable leads, not shown, to the electrode pair of one of the end disks, for example, resonant disk 14. Due to the proportioning of disk 14, it is excited by the 455 kc. component of the signal and resonates in its radial mode at a frequency of 455 kc. As previously explained the resonance may be fundamental or an overtone, depending on the size of disk 14. Due to the Poisson effect, coupling rod 16 is excited to longitudinal vibration at the same frequency. The longitudinal vibration of rod 16 is transmitted to disk 12 which is forced into radial mode vibration and generates an output signal which appears across its electrode pair.

The operation and impedance transformation of element 10 can be explained physically as follows: the disks 12 and 14 are weakly coupled resonators having approximately the same electromechanical activity at resonance and anti-resonance. With weak coupling the resonance of the one disk is only slightly affected by the fact that the other is operating at anti-resonance; at the same time, both disks are capable of efficient electromechanical power conversion. Consequently, power fed into resonant disk 14 at a low impedance level can be taken off at the anti-resonant disk 12 at a high impedance level and vice versa.

Figure 6A:
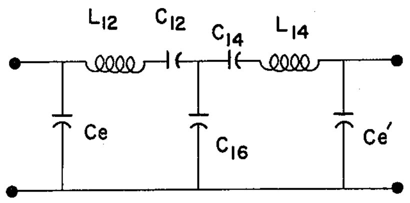

The operation of filter-transformer elements according to the invention can be explained also by equivalent circuit analysis. Thus FIGURE 6*a* represents the equivalent circuit of a filter-transformer element such as 10. In the circuit diagram, inductances $L_{12}$, $L_{14}$ represent the mass of the disks 12 and 14, respectively; capacitances $C_{12}$, $C_{14}$ represent the mechanical compliance of the respective disks; capacitances $C_e$, $C'_e$ represent the electrical capacity of the respective disks; and capacitance $C_{16}$ represents the mechanical compliance of coupling rod 16. This equivalent circuit was verified by construction and test of an electrical analogue which behaved exactly like the filter-transformer element 10.

Figure 6B:
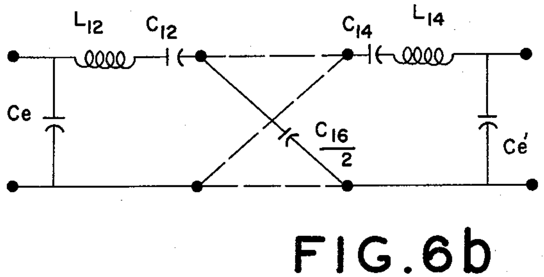
Figure 6C:
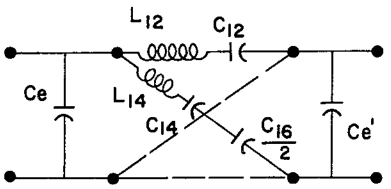
Figure 6D:
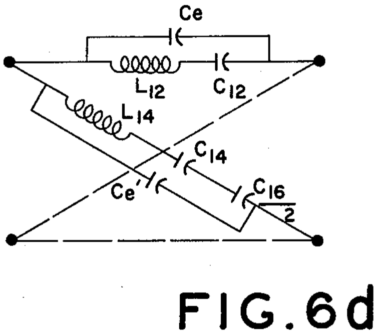

Applying Bartlett's bisection theorem, the ladder network of FIGURE 6*a* can be transformed to a symmetrical lattice network, FIGURE 6*d*, the successive intermediate stages of the transformation being shown in FIGURES 6*b* and 6*c*.

Referring to FIGURE 6*d* it will be noted that the compliance $C_{16}$ of coupling rod 16 appears only in the shunt arms of the lattice. As $C_{16}$ is large as compared to $C_{12}$ and $C_{14}$, the series combination of $C_{12}$ and $C_{16/2}$ has a somewhat smaller value than $C_{12}$ alone. Therefore, the shunt arms are resonant (and, likewise anti-resonant) at a slightly higher frequency than the series arms. Consequently the impedance of the element shows two pass bands, one at resonance and one at anti-resonance, i.e., assuming both disks are resonant at the same (center) frequency as described and claimed in the aforementioned U.S. Patent No. 2,877,432, one pass band occurs at this frequency and another pass band occurs at the anti-resonant frequency of the disks. Inasmuch as filter-transformer elements according to the present invention have one disk at resonant at the center frequency and the other anti-resonant at the same frequency, the values of $L_{14}$, $C_{14}$ (FIGURE 6*a*) of the anti-resonant disk are greater than the corresponding values of $L_{12}$ and $C_{12}$ by the ratio of anti-resonant to resonant frequency $(fa/fr)$ and $C_e$ is greater than $C_e'$ by the ratio $(fa/fr)^2$. The equivalent circuit of 6*a* is shown in FIGURE 7 redrawn to show the impedance transformation. By selection of the disk thickness and variation of electrode areas input impedances of from 5000 to 10,000 ohms and output impedances of 400 to 1000 ohms may be obtained.

The most important of the dimensional parameters are the length and thickness of coupling rod 16. Inasmuch as the compliance of the rod ($C_{16}$, FIGURE 7*a*) appears only in the shunt arm impedance, the bandwidth of the filter-transformer element can be controlled by varying the length and/or thickness of the coupling rod. Bandwidths ranging from 1 to 16% can be obtained in this manner.

It is desirable to have the coupling rod behave as a pure compliance; this can be by having its length equal to ⅛ wave length at the center frequency.

Up to a coupling rod length of about 2 millimeters, variation of this dimension has little effect on the filter characteristics of the exemplary element described. Above this value, spurious responses appear which shift in center frequency as the length is increased; nevertheless, elements having long (i.e., in excess of 2 mm.) coupling rods can be used at certain lengths to make elements of reasonably good wide-band filter characteristics.

The coupling rod diameter offers a convenient means of adjusting bandwidth, a small increase in diameter producing a relatively larger increase in bandwidth.

It will be appreciated that the thickness of disks 12, 14 affects several of the values of the equivalent circuit shown in FIGURE 6(*a*), viz., $C_{12}$, $C_{14}$, $L_{12}$, $L_{14}$, $C_e$, $C'_e$.

A thickness of 0.75 mm. or, preferably, 20% of disk diameter is a good minimum value.

As previously mentioned, the disk diameter is fixed primarily by the operating frequency. Other variables affecting the operating characteristics of the element are primarily inherent properties of the ceramic material, e.g., *Qm*, *kp*, K.

Figures 4, 5:
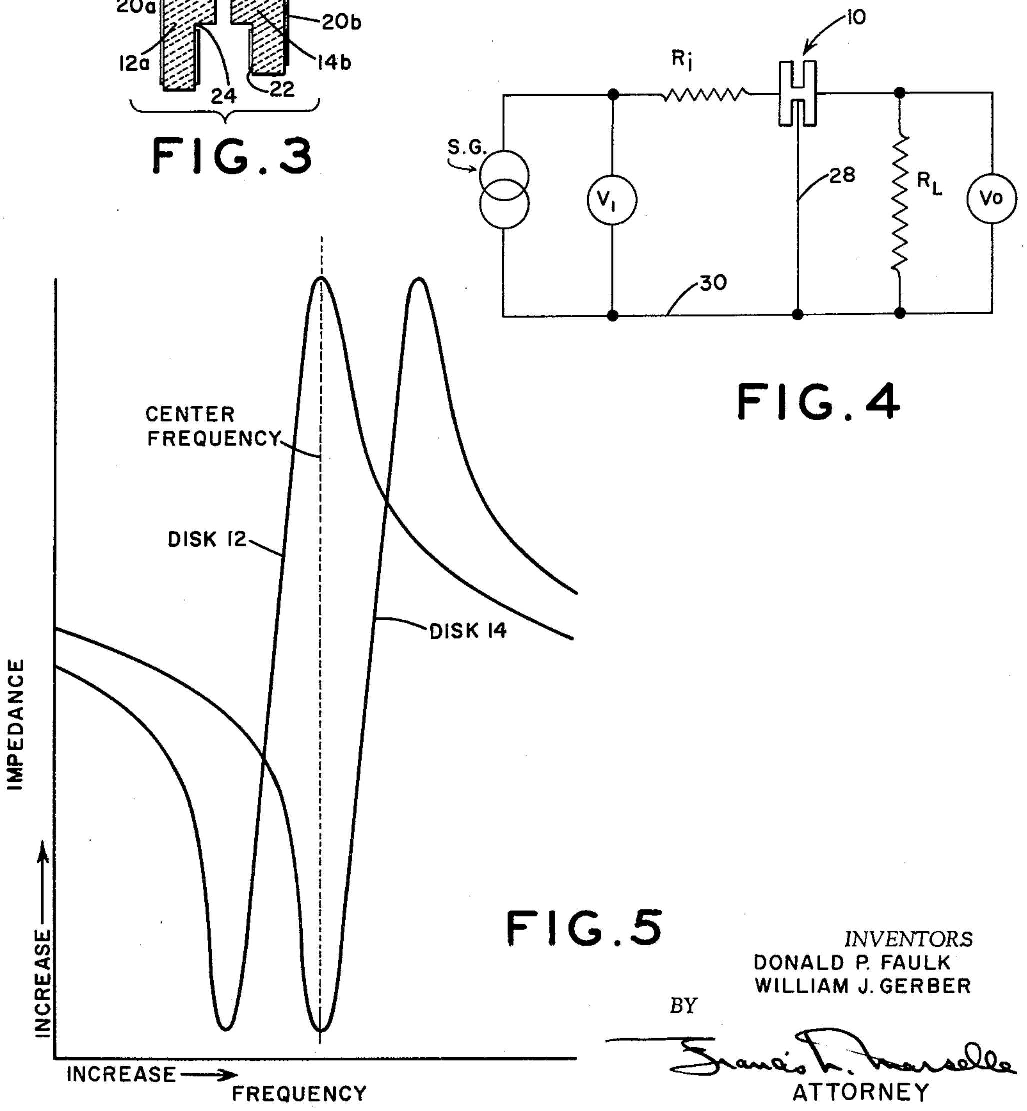
FIGURE 4 is a schematic diagram of an electrical circuit including a filter-transformer element according to the invention.
FIGURE 5 shows a pair of curves representative of the frequency-impedance relation in piezoelectric resonators.

As previously mentioned, FIGURE 4 illustrates schematically a test circuit embodying filter element 10. In the circuit, S.G. designates a signal generator or source and resistor $R_1$ represents the input impedance. An input voltmeter $V_1$ is connected across the signal source to measure the input voltage. Filter element 10 is provided with electrical connections as already described: the inner electrodes 18*a*, 18*b* of the respective disks 12, 14 are grounded by a common connection through leads 28, and 30 to one side of the signal source. It will be noted that the lead 28 is connected to rod 16 of element 10; as explained, this rod may be and, to use the particular wiring shown in FIGURE 5, must be formed of or covered with electrically conducting material which is in contact with the inner electrodes.

The output signal from filter element 10 appearing across load impedance $R_L$ is measured by a voltmeter $V_o$. The ratio of the reading of voltmeters $V_1$ and $V_o$ determines the power insertion loss (I.L.) of the filter elements according to the formula $$\text{I.L.} = 20 \log_{10}\left[\left(\frac{V_i}{2V_o}\right)\sqrt{\frac{R_L}{R_i}}\right]$$

The frequency response of the filter element was tested by varying the frequency of the applied signal through a range extending above and below the design pass band frequency of the element.

Typical of the frequency response characteristic of filter-transformer elements according to the present invention is the plot of insertion loss versus frequency shown in FIGURE 8. This particular response characteristic was obtained with a two disk filter-transformer element of the type shown and described in conjunction with FIGURE 1 and utilizing the test circuit illustrated in FIGURE 4. The element was designed for a center frequency of 455 kc. had an impedance transformation ratio of 20:1. The highly desirable features of the response curve and the filter characteristics which they represent will be readily apparent to those skilled in the art from FIGURE 8. The high signal-to-noise ratio and selectivity are particularly to be noted.

While there have been described what are at present considered to be the preferred embodiments of the invention, it will be obvious to those skilled in the art that various changes and modifications may be made therein without departing from the invention, and it is, therefore, aimed in the appended claims to cover all such changes and modifications as fall within the true spirit and scope of the invention.

We claim:

1. A frequency-selective impedance transformer comprising a pair of resonators one resonant at a preselected frequency and the other anti-resonant at said frequency; means mechanically coupling said resonators and adapted to transmit vibrations from one to the other; means for driving one of said resonators; and means for deriving a signal from the other of said resonators.

2. A frequency selective impedance transformer comprising a pair of discoid resonator bodies of polarizable ferroelectric ceramic material one resonant at a preselected frequency and the other anti-resonant at said frequency; electrode pairs conductively associated with each of said bodies; and means mechanically coupling corresponding central portions of said bodies and adapted to transmit vibrations from one to the other.

3. A frequency selective impedance transformer according to claim 2, said coupling means including at least one additional discoid body resonant at said preselected frequency.

4. A frequency selective impedance transformer according to claim 2, said coupling means comprising a cylindrical rod having a length and diameter small in comparison with diameters of said discoid bodies, said rod being coaxially disposed with respect to and having each end rigidly mechanically connected to one of said discoid bodies.

5. A frequency selective impedance transformer according to claim 4 wherein respective portions of the length of said rod are integral parts of each of said discoid bodies.

6. A filter-transformer comprising a group of at least two substantially discoid bodies at least two of which, endmost in the group, are composed of a polarizable ferroelectric ceramic and are poled in the axial direction, one of said two bodies being proportioned to have a resonance of mechanical vibration in the radial mode at a predetermined frequency and the other of said bodies being anti-resonant at said frequency; connecting means supporting said bodies in spaced coaxial relation and mechanically coupling the central portions thereof; and electrode means applied to the opposed major planar surfaces of each of said two bodies.

7. A piezoelectric filter-transformer element comprising a non-composite structure of ceramic material, said structure consisting of a group of discoid portions spaced and interconnected in coaxial relation by small coaxial cylindrical coupling portions having a length and diameter small in comparison to the diameters of said discoid sections, said ceramic material being a ferroelectric polycrystalline aggregate susceptible of permanent electrostatic polarization to impart piezoelectric properties thereto, the endmost discoid sections of said group being poled in the axial direction and each having electrode means applied to opposed surfaces thereof, one of said endmost discoid sections being proportioned to have a resonance of mechanical vibrations in the radial mode at a predetermined frequency and the other being proportioned for anti-resonance at said frequency.

8. A filter-transformer element comprising a pair of substantially discoid bodies composed of polarizable ferroelectric ceramic material and electrostatically poled in the axial direction; one of said bodies being proportioned to have a resonance of mechanical vibrations in the radial mode at a predetermined frequency within a preselected range of frequencies, and the other to be anti-resonant at said predetermined frequency; a coaxial coupling rod, having a diameter and length dimension short in comparison to the diameter of said bodies, inter-connecting said bodies; input electrode means associated with one of said two bodies for supplying a signal voltage thereto; and output electrode means associated with the other of said two bodies for deriving a signal voltage therefrom.

References Cited in the file of this patent

UNITED STATES PATENTS

| | | |
|---|---|---|
| 1,923,354 | Coursey | Aug. 22, 1933 |
| 2,276,013 | Bohannon | Mar. 10, 1942 |
| 2,342,875 | Lovell | Feb. 29, 1944 |
| 2,343,633 | Baldwin | Mar. 7, 1944 |
| 2,729,708 | Goodrich | Jan. 3, 1956 |
| 2,877,432 | Mattiat | Mar. 10, 1959 |